United States Patent
Lorber et al.

(10) Patent No.: US 11,971,279 B2
(45) Date of Patent: Apr. 30, 2024

(54) HIGH-RESOLUTION MODE FOR A MAGNETIC FIELD SENSOR

(71) Applicant: Infineon Technologies AG, Neubiberg (DE)

(72) Inventors: Patricia Lorber, Ossiach (AT); Simone Fontanesi, Villach (AT); Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/046,226

(22) Filed: Oct. 13, 2022

(65) Prior Publication Data
US 2023/0054830 A1 Feb. 23, 2023

Related U.S. Application Data

(63) Continuation of application No. 16/573,418, filed on Sep. 17, 2019, now Pat. No. 11,499,846.

(30) Foreign Application Priority Data

Sep. 19, 2018 (DE) .......................... 102018215938.6

(51) Int. Cl.
*G01D 5/244* (2006.01)
(52) U.S. Cl.
CPC .................... *G01D 5/244* (2013.01)
(58) Field of Classification Search
CPC .......... G01D 5/14; G01D 5/145; G01D 5/244; G01D 5/245; G01D 5/2451; G01D 5/246; G01P 3/487
See application file for complete search history.

(56) References Cited

U.S. PATENT DOCUMENTS

| | | | |
|---|---|---|---|
| 2003/0141862 A1* | 7/2003 | Vig .......................... | G01P 3/488 324/207.21 |
| 2005/0211002 A1* | 9/2005 | Hara ....................... | G01P 3/487 73/862.326 |

(Continued)

FOREIGN PATENT DOCUMENTS

| CN | 107850618 A | 3/2018 |
|---|---|---|
| CN | 108122401 A | 6/2018 |

(Continued)

OTHER PUBLICATIONS

Jun. 2, 2021—(CN) Office Action—App 201910764160.6.
Dec. 16, 2020—(KR) Office Action—App 10-2019-0114143.
Jun. 5, 2019—(DE) Office Action—App 102018215938.6.

*Primary Examiner* — Steven L Yeninas
(74) *Attorney, Agent, or Firm* — Banner & Witcoff Ltd.

(57) ABSTRACT

A magnetic field sensor includes a sensor and a processing circuit. The sensor is designed to generate on the basis of a varying magnetic field an oscillation signal that fluctuates around a mean value. The processing circuit is designed to generate an output signal on the basis of the oscillation signal. The processing circuit is designed, in a high-resolution mode different than a low-resolution mode, in each case to generate a mean value crossing pulse in the output signal when the oscillation signal attains the mean value, and to generate in each case a limit value crossing pulse in the output signal when the oscillation signal attains at least one limit value different than the mean value. A pulse width of at least either the mean value crossing pulse or the limit value crossing pulse is set to indicate that the magnetic field sensor is operating in the high-resolution mode.

18 Claims, 8 Drawing Sheets

(56) References Cited

U.S. PATENT DOCUMENTS

| | | | |
|---|---|---|---|
| 2008/0133158 A1 | 6/2008 | Koo | |
| 2017/0059359 A1* | 3/2017 | Kawasaki | G01P 13/045 |
| 2017/0160303 A1* | 6/2017 | Jöckel | G01P 3/489 |
| 2017/0219662 A1* | 8/2017 | Prentice | G01R 33/07 |
| 2017/0336225 A1* | 11/2017 | Burdette | G01P 13/045 |
| 2018/0174441 A1* | 6/2018 | Hainz | G08C 19/16 |
| 2018/0210004 A1* | 7/2018 | Tepass | G01P 3/489 |
| 2019/0353677 A1* | 11/2019 | Lim | H10N 50/85 |
| 2020/0081074 A1* | 3/2020 | Fontanesi | B60T 8/885 |

FOREIGN PATENT DOCUMENTS

| | | |
|---|---|---|
| DE | 68916884 T2 | 12/1994 |
| JP | 2007-174674 A | 7/2007 |

\* cited by examiner

HIGH-RESOLUTION MODE FOR A MAGNETIC FIELD SENSOR

TECHNICAL FIELD

The present disclosure is concerned with magnetic field sensors which output an output signal that enables a receiver to recognize that they are operating in a high-resolution mode, and with methods for generating corresponding output signals of magnetic field sensors.

BACKGROUND

Magnetic field sensors are used to measure magnetic fields. Examples of magnetic field sensors include Hall sensor devices, for example, which supply an output signal that is proportional to a magnetic field present. Magnetic field sensors find application in many fields in order to detect relative movements between the magnetic field sensor and a magnetic element. The magnetic element can comprise one or more pole pairs, for example, such that, in the event of a relative movement between the magnetic field sensor and the magnetic element, the magnetic field sensor generates an oscillation signal that fluctuates around a mean value.

One example of such magnetic field sensors is wheel speed sensors that detect a wheel speed. In the case of such wheel speed sensors, a pole wheel having one or a plurality of pole pairs can be arranged on an axle around which the wheel rotates, such that when the wheel rotates, the pole wheel generates a varying magnetic field that is detected by the magnetic field sensor in order to generate an oscillation signal that fluctuates around a mean value. The speed at which the wheel rotates can be determined using the oscillation signal. Corresponding wheel speed sensors can be used for example in motor vehicles for autonomous parking applications and autonomous driving applications.

Generally, magnetic field sensors, on the basis of the detected signal, can output an output signal in accordance with a signal protocol. In the case of one protocol, a so-called AK protocol, a pulse sequence is generated upon each zero crossing of the oscillation signal, wherein a first pulse having a first pulse height indicates the zero crossing and succeeding pulses having a second, smaller height represent information bits that can indicate further information. In the case of another protocol, a so-called PWM protocol (PWM=pulse width modulation), an individual pulse is generated upon each zero crossing of the oscillation signal. The width of the pulse can be modulated in order to contain information; by way of example, the pulses can have a first width when the wheel rotates in a first direction, and the pulses can have a second width when the wheel rotates in a second direction.

Overview

Magnetic field sensors would be desirable which make it possible to output an output signal with higher resolution, which output signal furthermore makes it possible to recognize that the magnetic field sensor is operating in a high-resolution mode.

Examples of the present disclosure provide a magnetic field sensor comprising a sensor unit and a processing circuit. The sensor unit is designed to generate on the basis of a varying magnetic field an oscillation signal that fluctuates around a mean value. The processing circuit is designed to generate an output signal on the basis of the oscillation signal. In a high-resolution mode different than a low-resolution mode, the processing circuit is designed, in each case to generate a mean value crossing pulse in the output signal when the oscillation signal attains the mean value, and to generate in each case a limit value crossing pulse in the output signal when the oscillation signal attains at least one limit value different than the mean value. A pulse width of at least either the mean value crossing pulse or the limit value crossing pulse is set to indicate that the magnetic field sensor is operating in the high-resolution mode.

Examples of the present disclosure provide a method for generating an output signal of a magnetic field sensor, wherein an oscillation signal that fluctuates around a mean value is generated on the basis of a varying magnetic field. The output signal is generated on the basis of an oscillation signal, wherein, in a high-resolution mode different than a low-resolution mode, in each case a mean value crossing pulse is generated in the output signal when the oscillation signal attains the mean value, and in each case a limit value crossing pulse is generated in the output signal when the oscillation signal attains at least one limit value different than the mean value. A pulse width of at least either the mean value crossing pulse or the limit value crossing pulse is set to indicate that the method is operating in the high-resolution mode.

Examples of the present disclosure thus yield an output signal of a magnetic field sensor which uses a PWM protocol for a high-resolution mode. In this case, pulses are generated in the output signal not only upon mean value crossings but also upon additional limit value crossings. In this case, the pulse widths in the output signal are set to enable a receiver to recognize that the magnetic field sensor is operating in the high-resolution mode. Consequently, in accordance with the present disclosure, it is possible to generate an output signal with high resolution recognizably for a receiver in a simple manner.

BRIEF DESCRIPTION OF THE DRAWINGS

Examples of the disclosure are described below with reference to the accompanying drawings, in which.

DETAILED DESCRIPTION

Hereinafter, examples of the present disclosure are described in detail and using the accompanying descriptions. It should be pointed out that identical elements or elements having the same functionality may be provided with identical or similar reference signs, a repeated description of elements provided with the same or similar reference signs typically being omitted. Descriptions of elements having identical or similar reference signs are mutually interchangeable. In the following description, many details are described in order to yield a more thorough explanation of examples of the disclosure. However, it is evident to those skilled in the art that other examples can be implemented without these specific details. Features of the various examples described can be combined with one another, unless features of a corresponding combination are mutually exclusive or such a combination is expressly excluded.

Figure 1:
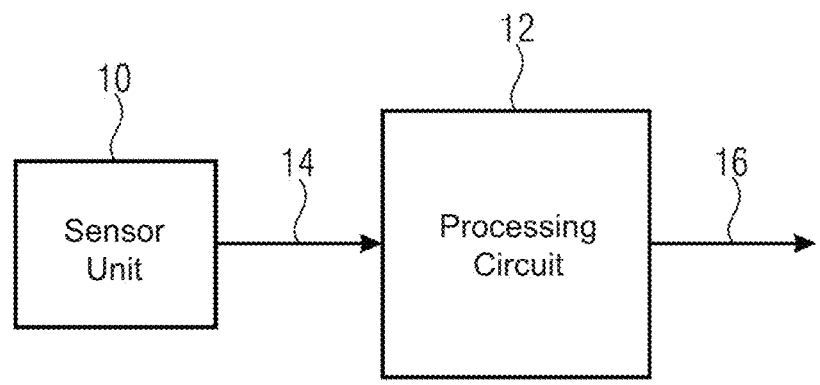
FIG. 1 shows a schematic illustration of one example of a magnetic field sensor.

FIG. 1 schematically shows a magnetic field sensor comprising a sensor unit 10 and a processing circuit 12. The sensor unit 10 is designed to generate an oscillation signal 14 on the basis of a varying magnetic field. The processing circuit 12 receives the oscillation signal 14 and is designed to generate an output signal 16 on the basis thereof.

Figure 3:
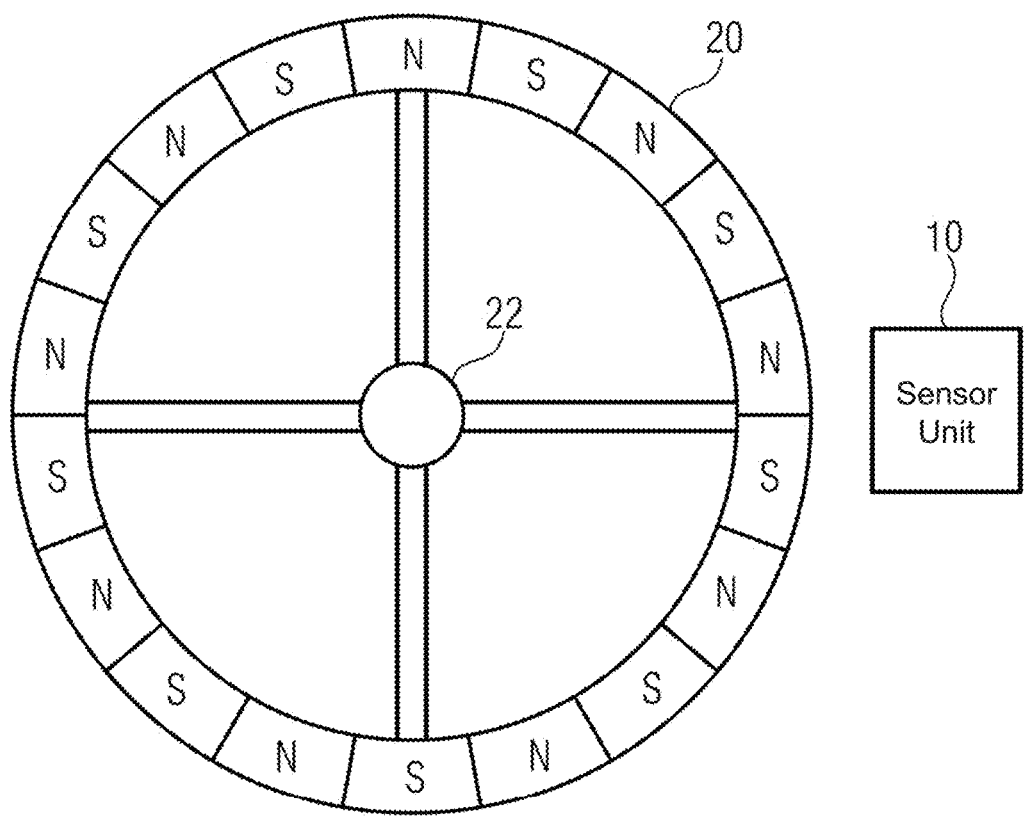
FIG. 3 schematically shows an arrangement of a magnetic field sensor and a pole wheel.

In examples, the sensor unit 10 can be designed to generate the oscillation signal on the basis of a rotation of a pole wheel 20, as is illustrated schematically in FIG. 3. The pole wheel 20 can be mounted rotatably on a shaft 22. The pole wheel can have one or, as is shown schematically in FIG. 3, a plurality of pole pairs of magnetic north poles and magnetic south poles. The sensor unit 10 is positioned relative to the pole wheel 20 in such a way that, on the basis of the magnetic field that varies on account of a rotation of the pole wheel 20, said sensor unit generates an oscillation signal that fluctuates around a mean value. In examples, the frequency of the oscillation signal can thus be dependent on a rotational frequency, for example on the rotational frequency of a wheel that rotates with the shaft 22.

In examples, the oscillation signal can be sinusoidal. In other examples, the oscillation signal can have a different oscillation shape, for example triangular or sawtooth-shaped.

In examples, the sensor unit is designed to generate on the basis of the varying magnetic field an oscillation signal representing an angle that fluctuates between 0° and 360°. Mean value crossings of said oscillation signal can correspond to angles of 0° and 180°. In examples, the sensor unit can be designed to generate on the basis of the varying magnetic field two signals that are phase-shifted by 90° with respect to one another, and to carry out an angle calculation from these signals using the atan function or the CORDIC algorithm. In such examples, attaining the mean value in the oscillation signal and attaining limit values different than the mean value in the oscillation signal represent in each case the attaining of corresponding angles. In examples, mean value crossings of the oscillation signal correspond to angles of 0° and 180°. Limit values that are different than the mean value can correspond to an angle of 90° and 270°, for example.

Figure 4:
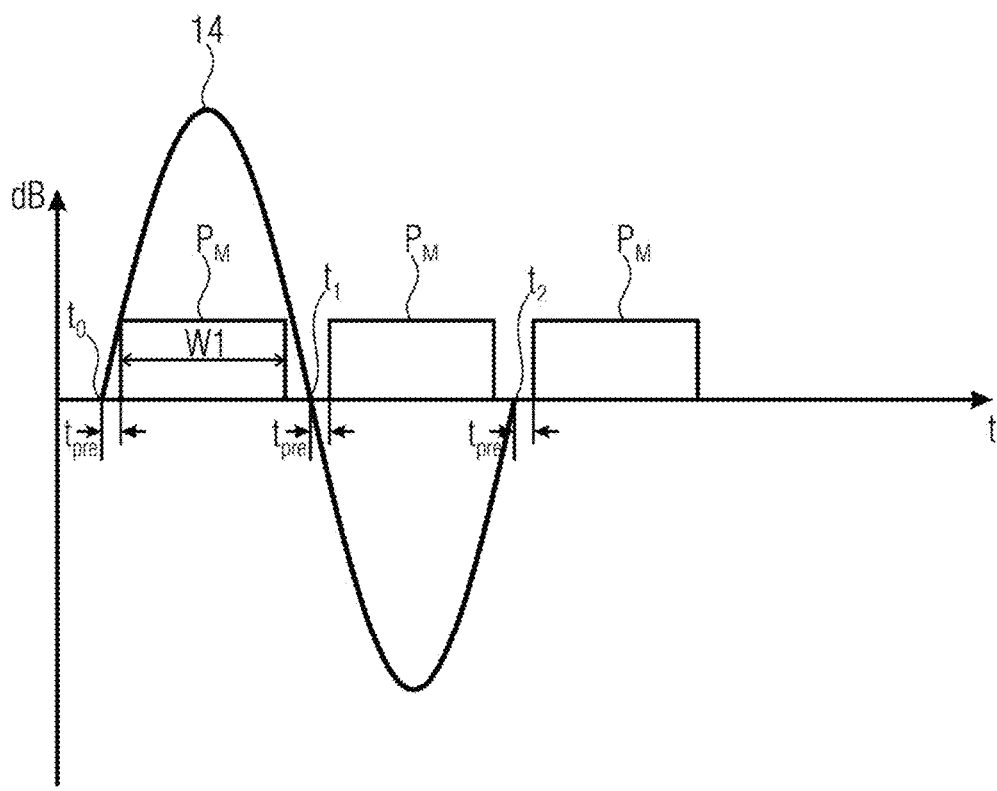
FIG. 4 shows a schematic illustration for elucidating a low-resolution mode.

FIG. 4 shows an illustration of a sinusoidal oscillation signal 14 over time, the amplitude of said signal being illustrated in dB. Only one period of the oscillation signal is illustrated in FIG. 4, wherein it is obvious to those skilled in the art that this is a periodic oscillation signal.

The mean value of the oscillation signal in FIG. 4 is 0 and the oscillation signal shown has three zero crossings at $t_0$, $t_1$ and $t_2$. By way of example, the zero crossings at $t_0$, $t_1$ and $t_2$ can correspond to angles of 0°, 180° and 360°. As is shown in FIG. 4, in each case a mean value crossing pulse $P_M$ is generated when the oscillation signal attains the mean value, 0 in the example shown. As is shown in FIG. 4, a predetermined time duration $t_{pre}$ can elapse between the generation of the mean value crossing pulse and the mean value crossing. As is furthermore shown in FIG. 4, the pulses $P_M$ are generated with a pulse width w1.

The output signal having the pulse $P_M$ as shown in FIG. 4 represents an output signal such as is generated on the basis of the oscillation signal 14 in a low-resolution mode. In examples of the present disclosure, the processing circuit 12 is designed, in a high-resolution mode different than the low-resolution mode, to generate in each case a mean value crossing pulse $P_M$ in the output signal when the oscillation signal attains the mean value, and to generate in each case a limit value crossing pulse in the output signal when the oscillation signal attains at least one limit value different than the mean value. A sensor output signal of higher resolution may generally be advantageous since it represents a signal measured by the sensor with higher accuracy or can make it possible to derive additional information, such as e.g. jitter values.

Figure 5:
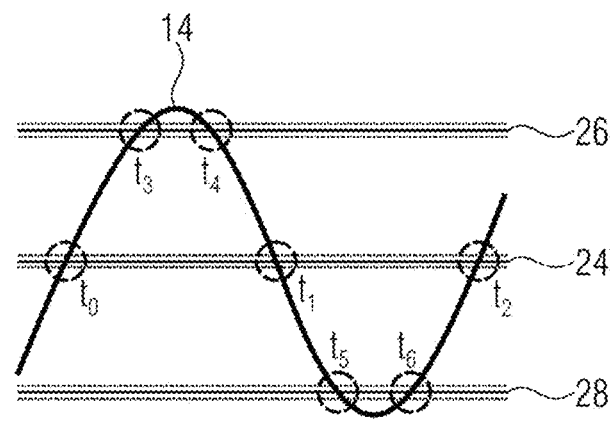
FIG. 5 shows a schematic illustration for elucidating a high-resolution mode.

FIG. 5 schematically shows the oscillation signal 14 that fluctuates around a mean value 24, wherein an upper limit value 26 and a lower limit value 28 of the oscillation signal 14 are furthermore illustrated. The oscillation signal 14 attains the mean value 24 at the points in time $t_0$, $t_1$ and $t_2$. The oscillation signal 14 attains the upper limit value 26 at the points in time $t_0$ and $t_4$. The oscillation signal attains the lower limit value 28 at the points in time $t_0$ and $t_6$. In examples, the processing circuit is designed to generate in each case a limit value crossing pulse in the output signal 16 (not shown in FIG. 5) when the oscillation signal 14 attains the upper limit value 26, points in time $t_0$ and $t_4$, and when the oscillation signal 14 attains the lower limit value 28, points in time $t_0$ and $t_6$.

It should be pointed out at this juncture that the formulation that a pulse is generated when the oscillation signal attains a limit value is intended to mean that attaining the limit value is the cause of the generation of the pulse, wherein there may be a time duration between the limit value being attained and the pulse being generated; see, for example, the delay $t_{pre}$ illustrated in the figures.

Figure 6:
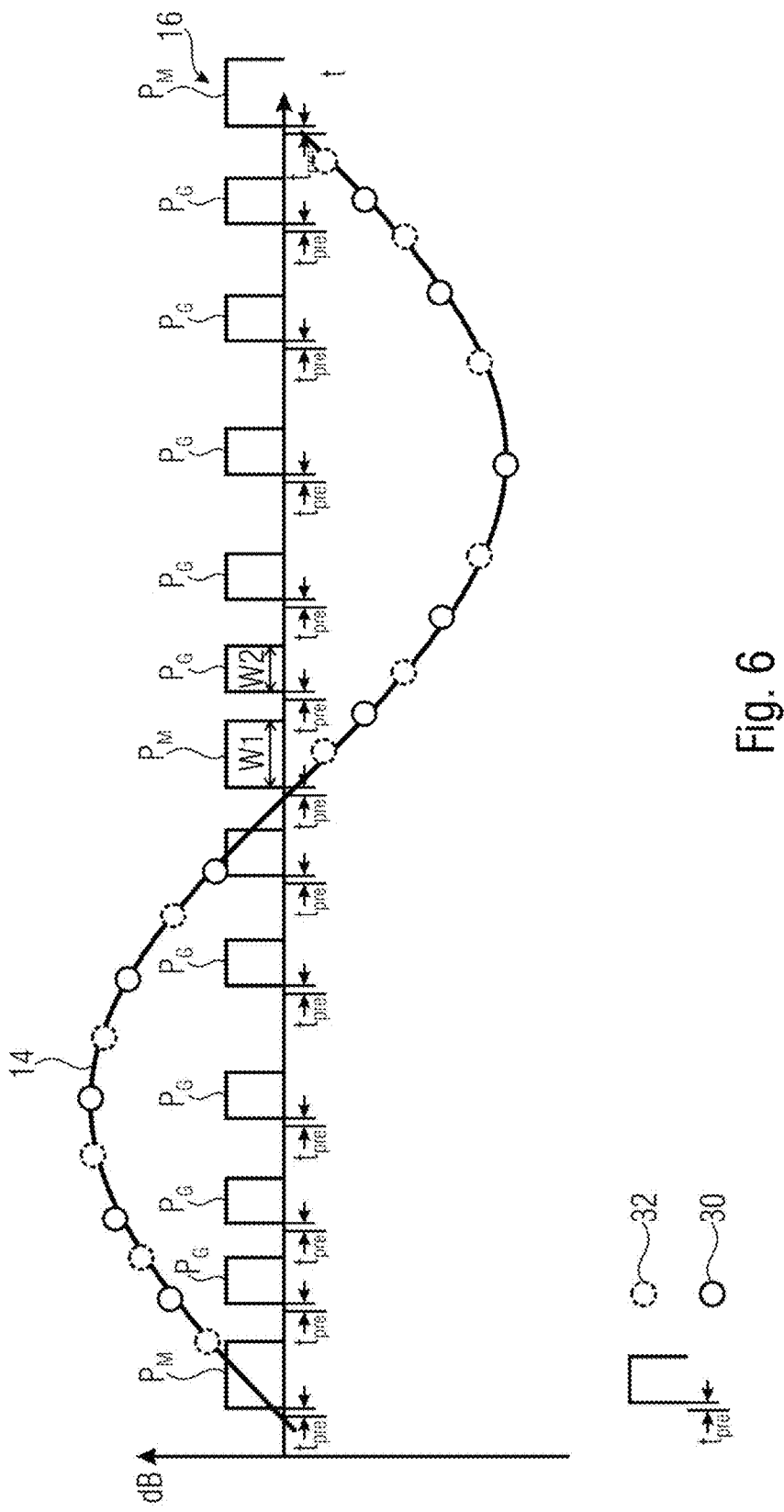
FIGS. 6 to 9 show signal diagrams for elucidating examples of how output signals can be generated from oscillation signals in accordance with the present disclosure.

FIG. 6 shows one example of the output signal 16 when the processing circuit is operating in the high-resolution mode. A mean value crossing pulse $P_M$ is generated in the output signal 16 when the oscillation signal 14 attains the mean value, as already explained in association with FIG. 3. Furthermore, respective limit value crossing pulses $P_G$ are generated in the output signal 16 when the oscillation signal 14 attains limit values 30 different than the mean value, said limit values being indicated by solid circles in FIG. 6. It should be noted at this juncture that the limit values 30 in FIG. 6 are purely schematic and that other limit values 32 can be used in actual implementations, examples of which other limit values are indicated by dashed circles 32 in FIG. 6. The limit values shown in FIG. 6 should be regarded as purely schematic, wherein the limit values and the pulse widths in the output signal 16 should be coordinated with one another such that no overlaps of the pulses take place.

In the example shown, the pulse width of the mean value crossing pulses $P_M$ is w1 and the pulse width of the limit value crossing pulses $P_G$ is w2. The processing circuit is thus designed to generate the limit value crossing pulses $P_G$ with a pulse width that differs from a pulse width of the mean value crossing pulses $P_M$. In such examples, the pulse width of the limit value crossing pulses is thus set to indicate that the magnetic field sensor is operating in the high-resolution mode, by virtue of the pulse width of the limit value crossing pulses differing from that of the mean value crossing pulses. By way of example, a receiver that receives the output signal 16, on the basis of the fact that the output signal 16 has pulses of different widths, can recognize that the magnetic field sensor is operating in the high-resolution mode.

In examples, the processing circuit can be designed to operate exclusively in the high-resolution mode, depending on a rotational frequency of a wheel of the vehicle. In such examples, the processing circuit can be designed to operate in the high-resolution mode over the entire measurement range of the rotational frequency, which can correspond to a vehicle speed range of 0 to 300 km/h.

In examples, the processing circuit can be designed to operate either in the high-resolution mode or in the low-resolution mode, wherein, in the low-resolution mode, the processing circuit is designed to generate only mean value crossing pulses in the output signal.

Figure 2:
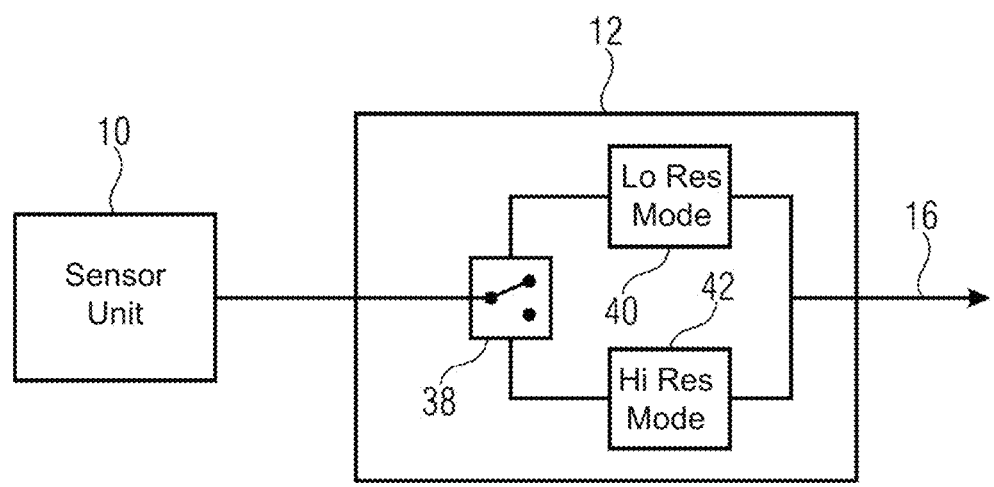
FIG. 2 shows a schematic illustration of one example of a magnetic field sensor designed to operate either in a high-resolution mode or in a low-resolution mode.

FIG. 2 shows one exemplary embodiment of a corresponding magnetic field sensor comprising the sensor unit 10 and the processing circuit 12. The processing circuit 12 is switchable between a low-resolution mode 40 and a high-resolution mode 42, as is indicated by corresponding blocks and a switch 38 in FIG. 2. Depending on whether the processing circuit 12 is switched into the low-resolution mode 40 or the high-resolution mode 42, the output signal 16 has only mean value crossing pulses $P_M$ (low-resolution mode) or mean value crossing pulses $P_M$ and limit value crossing pulses $P_G$ (high-resolution pulses).

In examples, the magnetic field sensor can be designed to switch over between the low-resolution mode 40 and the high-resolution mode 42 when a frequency of the oscillation signal attains a limit frequency. Above said limit frequency, only mean value crossing pulses are then generated in the output signal 16 and, below said frequency, both mean value crossing pulses and limit value crossing pulses are then generated in the output signal 16. In examples, said limit frequency can correspond to a rotational frequency of the wheel, which corresponds for example to a vehicle speed of 30 km/h. In examples, the high-resolution mode is thus used when traveling slowly, such as e.g. when parking a vehicle. The risk of incorrect values being determined on the basis of the output signal of the magnetic field sensor on account of a slower speed or on account of the engine stalling can thus be reduced.

In examples of the present disclosure, the processing circuit is designed to generate all pulses in the output signal with an identical level. As a result, the output signal differs unambiguously from signals that are generated for example using an AK protocol.

Generally, the resolution that can be achieved is limited only by the defined pulse widths. In examples, it is thus possible to achieve a 3-fold, 6-fold or 12-fold higher resolution, depending on the number of additional limit values for which limit value crossing pulses are generated.

Figure 7:
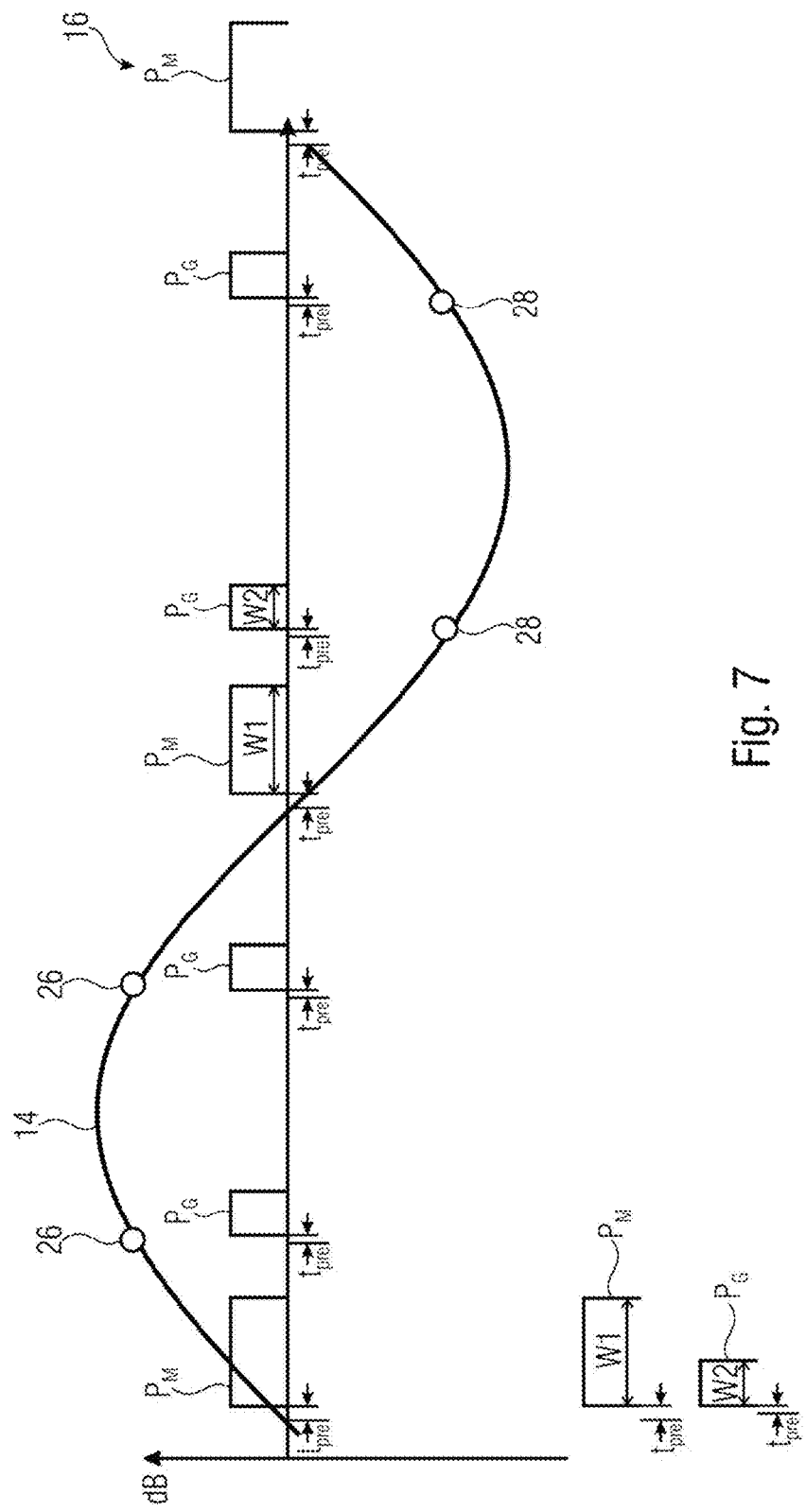

FIG. 7 shows a schematic illustration of an oscillation signal 14 and of an output signal 16 generated on the basis thereof. In the example shown in FIG. 7, limit value crossing pulses $P_G$ are generated for two additional limit values, an upper limit value 26 and a lower limit value 28. A 3-fold higher resolution can thus be achieved. In this example, the limit value crossing pulses $P_G$ once again have a smaller width w2 than the mean value crossing pulses $P_M$, which have a pulse width w1. In this case, the pulse width w1 can correspond to standard lengths of DR-R or DR-L pulses. DR-R pulses in this case correspond to pulses which are generated in accordance with a standard PWM protocol in the case of corresponding mean value crossings or zero crossings in the case of a direction of rotation toward the right, and DR-L pulses in this case correspond to pulses which are generated in accordance with the standard PWM protocol in the case of a direction of rotation toward the left. Depending on the direction of rotation, the mean value crossing pulses can thus have different pulse widths. The limit value crossing pulses $P_G$ can have a pulse width different than said pulse widths, for example a smaller pulse width w2. A receiver can thus recognize from the different pulse widths that the magnetic field sensor is operating in the high-resolution mode.

Figure 8:
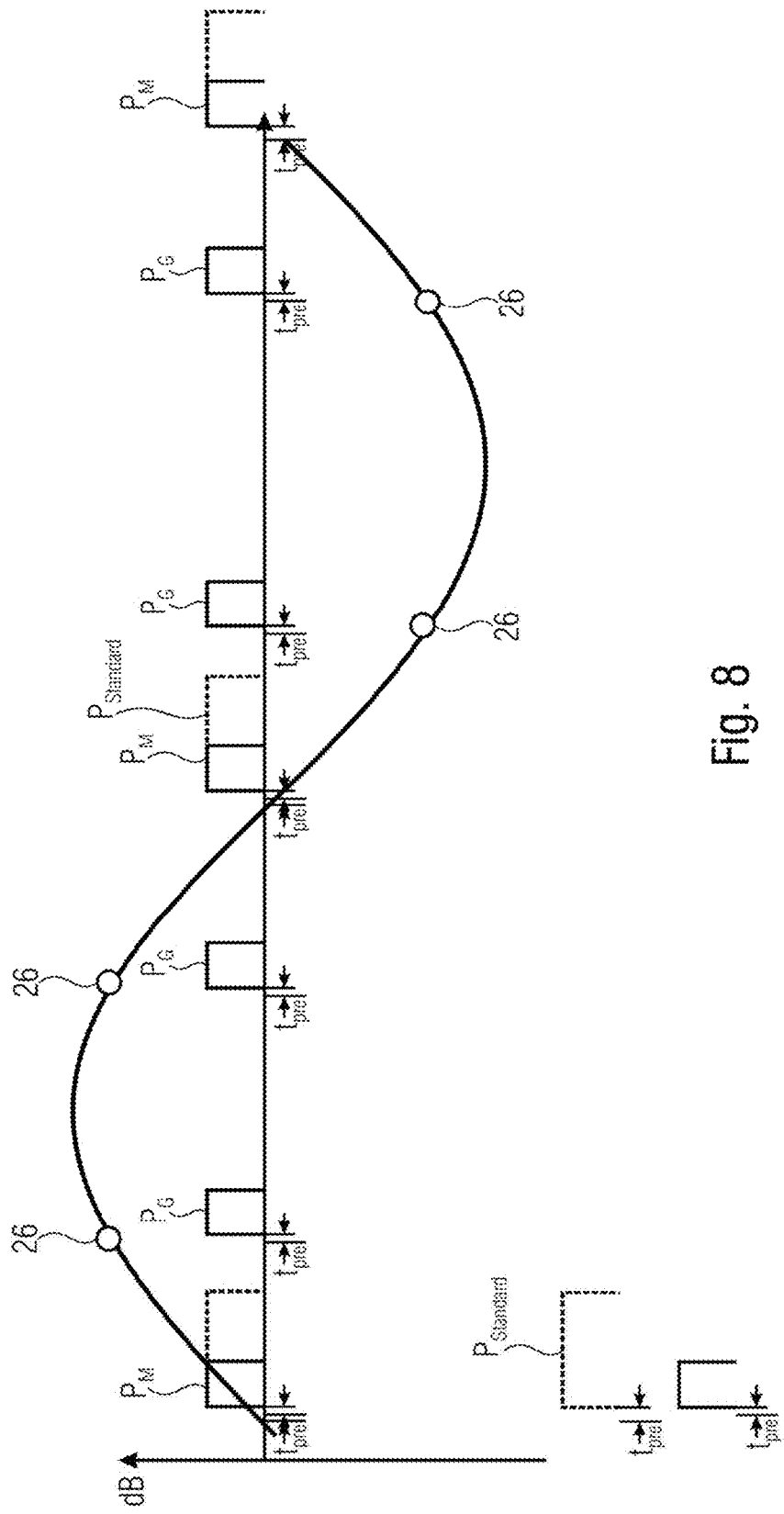

In examples, the processing circuit is designed, in the high-resolution mode, to generate the mean value crossing pulses and the limit value crossing pulses with the same pulse width, which differs from a pulse width of the mean value crossing pulses in the low-resolution mode. FIG. 8 shows one example of a corresponding output signal 16 in which the mean value crossing pulses $P_M$ and the limit value crossing pulses $P_G$ have the same pulse width. This pulse width differs from the pulse width or the pulse widths used in the low-resolution mode. In the low-resolution mode, the output signal can be transmitted in accordance with a conventional standard PWM protocol, in which only a low-resolution mode exists. Corresponding pulses $P_{Standard}$ such as are used in accordance with the standard PWM protocol are illustrated by dashed lines in FIG. 8. In such examples, a receiver that receives the output signal can recognize that the magnetic field sensor is operating in the high-resolution mode since the pulses have a pulse width that does not occur in the low-resolution mode. In examples, both the mean value crossing pulses and the limit value crossing pulses have a pulse width such as does not occur in the case of DR-R pulses and DR-L pulses in the PWM low-resolution mode. A receiver of the output signal can thus distinguish whether the magnetic field sensor is operating in the high-resolution mode or the low-resolution mode.

Figure 9:
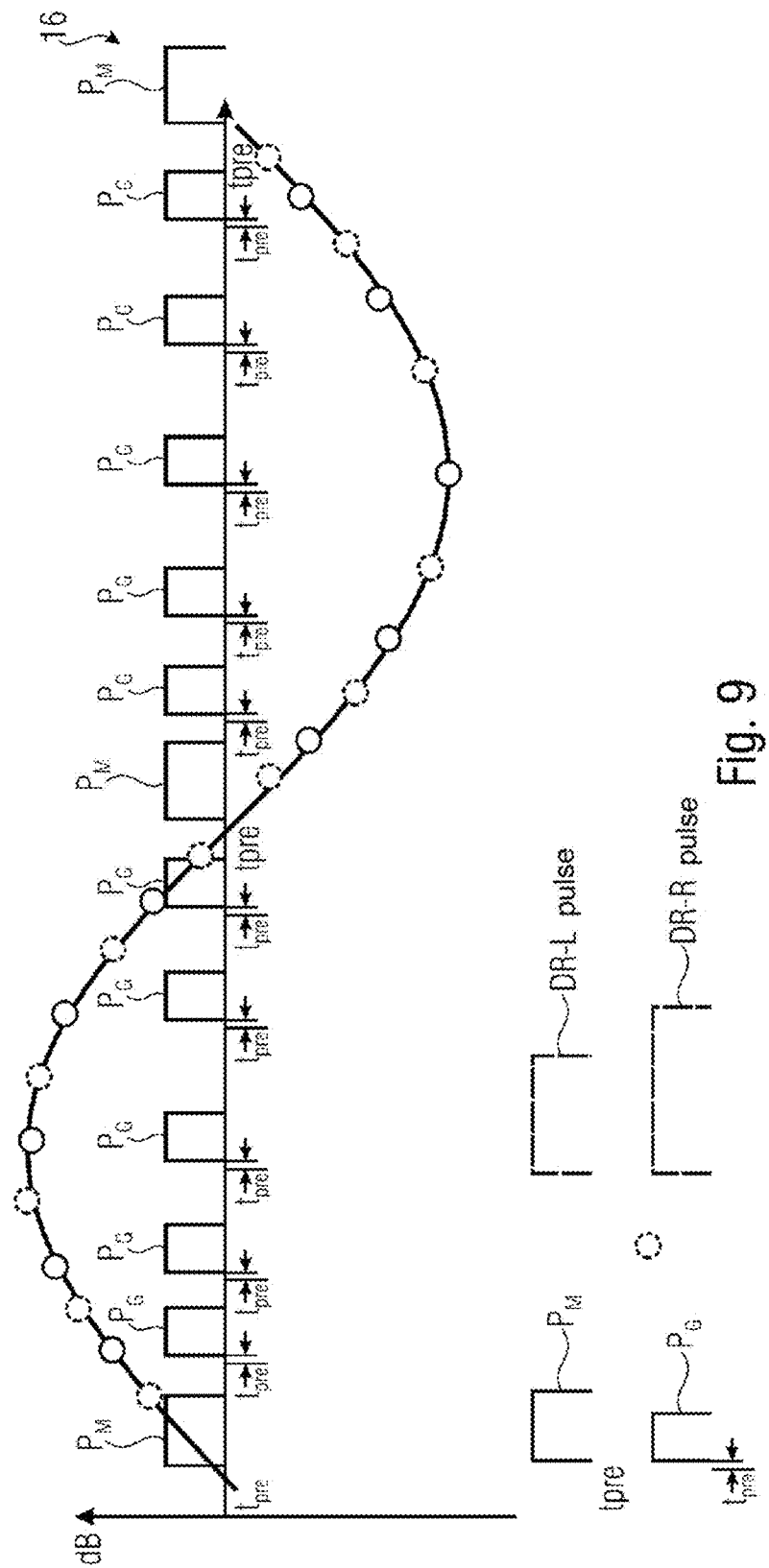

FIG. 9 shows one example of an output signal 16 in which the mean value crossing pulses $P_G$ and the limit value crossing pulses $P_M$ have different pulse widths and all pulses have a pulse width that differs from each pulse width that occurs in the low-resolution mode. By way of example, in FIG. 9, a DR-L pulse and a DR-R pulse of the low-resolution mode are illustrated by dashed lines and the pulse width thereof differs both from the pulse width of the pulses $P_M$ and from the pulse width of the pulses $P_G$ in the high-resolution mode. It is thus possible to recognize the high-resolution mode and the low-resolution mode both on the basis of the different pulse widths of the pulses $P_G$, $P_M$ that occur in the output signal 16, and on the basis of the pulse widths that differ from the pulse widths of the DR-L pulses and DR-R pulses that occur in the low-resolution mode. A receiver, for example an electronic control unit, ECU, that receives the output signal 16 can thus recognize which pulses can be used for jitter measurements. This can ensure a clear differentiation between the high-resolution mode and the low-resolution mode, which can correspond to a conventional standard PWM mode, and makes it possible for the electronic control unit to know which of the pulses are mean value crossing pulses $P_M$.

In examples, the magnetic field sensor can be designed to detect a movement of a magnet moving relative to the magnetic field sensor. The processing circuit can be designed to generate the mean value crossing pulses $P_M$ with a first pulse width if the movement takes place in a first direction, and to generate said mean value crossing pulses with a second pulse width different than the first pulse width if the movement takes place in a second direction opposite to the first direction. In examples, the first pulse width and the second pulse width can correspond to the pulse widths of standard DR-R pulses and standard DR-L pulses. In examples, the first and second pulse widths can differ from such standard pulse widths.

Generally, in a standard PWM protocol, further pulse widths may exist in order to indicate information. By way of example, in a standard PWM protocol, a specific pulse width is used to indicate that a signal level of the signal generated by the sensor unit is lower than a threshold level, wherein such pulses are known as so-called EL pulses, which yield information about the fact that the installation position is critical. If such information is no longer required, in examples, the pulse width of such pulses can be used to indicate that the magnetic field sensor is operating in the high-resolution mode.

In examples, pulse widths such as are used in standard PWM protocols can be adapted by a factor of, for example, 0.5 for all or for only the limit value crossing pulses. In examples, additional pulse widths can be used to indicate additional limit value crossing pulses $P_G$ or even to number limit value crossing pulses $P_G$ successively. Since limit value crossing pulses $P_G$ are generated only in the high-resolution mode, they can also be referred to as high-resolution pulses. In examples, in the high-resolution mode, the processing circuit is designed to generate in each case a first limit value crossing pulse $P_G$ in the output signal 16 when the oscillation signal 16 attains a first limit value different than the mean value, and to generate a second limit value crossing pulse in the output signal 16 when the oscillation signal 14 attains a second limit value different than the mean value and the first limit value, wherein the first limit value crossing pulse and the second limit value crossing pulse have different pulse widths.

The high-resolution pulses can be generated with pulse widths that lie between pulse widths used in standard PWM protocols. By way of example, pulse widths for standard DR-L pulses lie in a range of 76 to 104 μs, typically 90 μs, and the pulse width of standard DR-R pulses lies between 154 and 207 μs, typically 180 μs. The pulse width of a standard DR-L pulse including EL pulse lies between 306 and 414 μs, typically 360 μs, and the pulse width of a standard DR-R pulse including EL pulse lies between 616 and 828 μs, typically 720 μs. Pulse widths for high-resolution pulses of the PDM protocol can lie between these pulse widths with a sufficient separation, wherein a separation between the pulse width of high-resolution pulses and standard PWM pulses can be in each case 45 μs, for example.

Figure 10:
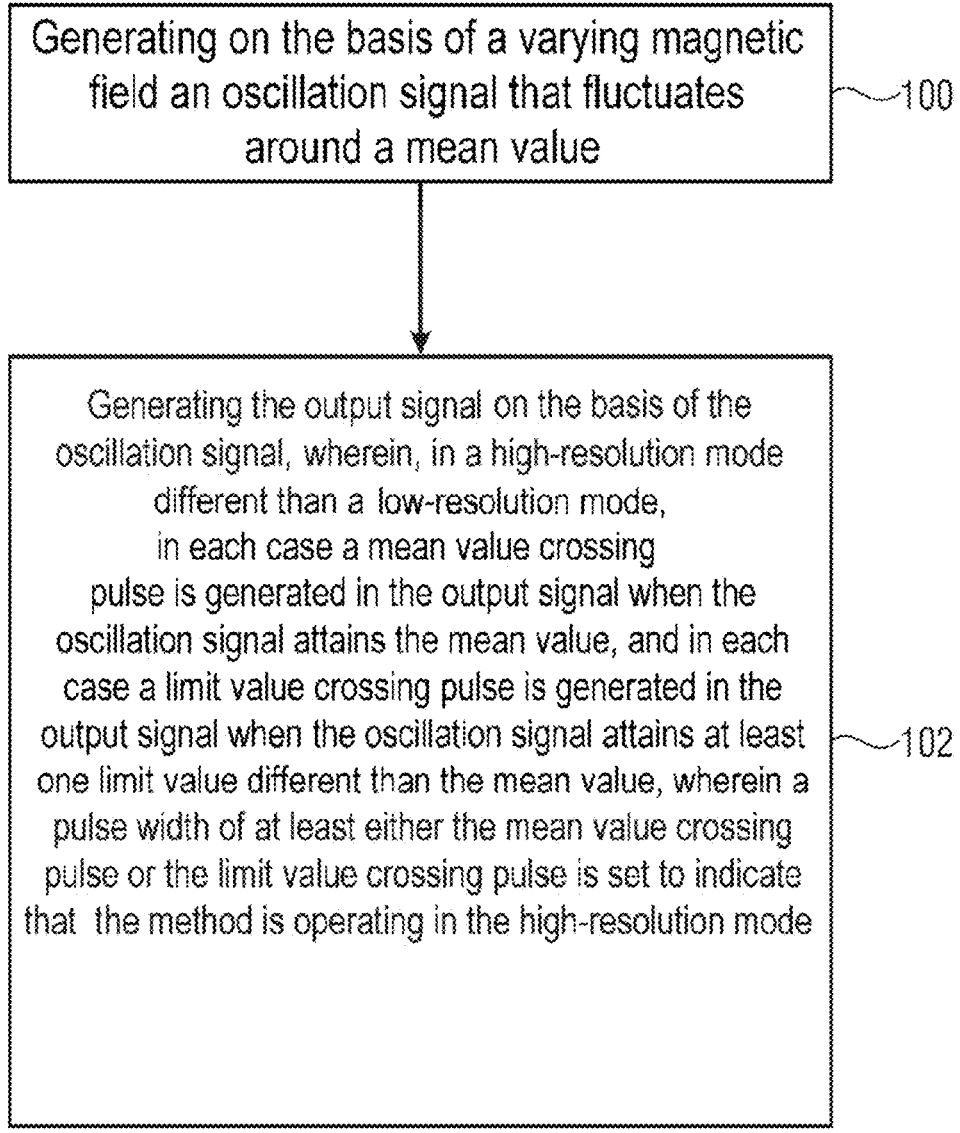
FIG. 10 shows a schematic illustration of one example of a method for generating an output signal of a magnetic field sensor in accordance with the present disclosure.

FIG. 10 schematically shows a flow diagram of one example of a method in accordance with the present disclosure. At 100, an oscillation signal that fluctuates around a mean value is generated on the basis of a varying magnetic field. At 102, the output signal is generated on the basis of the oscillation signal. Here, in a high-resolution mode different than a low-resolution mode, in each case a mean value crossing pulse is generated in the output signal when the oscillation signal attains the mean value. When the oscillation signal attains at least one limit value different than the mean value, in each case a limit value crossing pulse is generated in the output signal. A pulse width of at least either the mean value crossing pulse or the limit value crossing pulse is set to indicate that the method is operating in the high-resolution mode.

Examples of the present disclosure thus make it possible to generate and transmit a high-resolution output signal using a PWM protocol. The fact that the output signal is a high-resolution output signal, i.e. that the magnetic field sensor is operating in the high-resolution mode, is indicated by the pulse width of pulses in the output signal. This enables receiver circuits, for example electronic control units of motor vehicles, to recognize that the magnetic field sensor is operating in the high-resolution mode. This enables the receiver circuits to interpret and to evaluate the output signal correctly. Since the information as to whether the sensor is operating in the high-resolution mode is encoded by the pulse width, it is not necessary to transmit pulses having different pulse heights. Furthermore, it is not necessary to transmit digital data containing the corresponding information. Since in each case only one pulse has to be transmitted upon each crossing through a mean value or limit value, respectively, the high-resolution mode is not limited to low rotational frequencies, but rather can be implemented over the entire measurement range, for example over an entire vehicle speed range.

Examples of the present disclosure make it possible to extend standard PWM protocols, which have only a low-resolution mode, by additionally introducing a high-resolution mode.

Examples of the present disclosure relate to wheel speed sensors which comprise a magnetic field sensor as disclosed herein and which output an output signal indicating a wheel speed. In examples, the output signal of the magnetic field sensor can be used for autonomous driving applications, for example autonomous parking applications.

In examples, the processing circuit can be implemented by any suitable circuit structures, for example microprocessor circuits, ASIC circuits, CMOS circuits and the like. In examples, the processing circuit can be implemented as a combination of hardware structures and machine-readable instructions. By way of example, the processing circuit can comprise a processor and storage devices that store machine-readable instructions that result in methods described herein being carried out when they are executed by the processor.

Although some aspects of the present disclosure have been described as features in association with a device, it is clear that such a description can likewise be regarded as a description of corresponding method features. Although some aspects have been described as features in association with a method, it is clear that such a description can also be regarded as a description of corresponding features of a device or of the functionality of a device.

In the detailed description above, in some instances different features have been grouped together in examples in order to rationalize the disclosure. This type of disclosure ought not to be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

In accordance with aspect 1, a magnetic field sensor has the following features: a sensor unit designed to generate on the basis of a varying magnetic field an oscillation signal that fluctuates around a mean value; and a processing circuit designed to generate an output signal on the basis of the oscillation signal, wherein, in a high-resolution mode different than a low-resolution mode, the processing circuit is designed to generate in each case a mean value crossing pulse in the output signal when the oscillation signal attains the mean value, and to generate in each case a limit value crossing pulse in the output signal when the oscillation signal attains at least one limit value different than the mean value, wherein a pulse width of at least either the mean value crossing pulse or the limit value crossing pulse is set to indicate that the magnetic field sensor is operating in the high-resolution mode.

In accordance with aspect 2, in the case of a magnetic field sensor according to aspect 1, the oscillation signal represents an angle that fluctuates between 0° and 360°, wherein successive mean value crossings of the oscillation signal correspond to angles of 0° and 180°, and wherein the at least one limit value corresponds to an angle different than 0° and 180°.

In accordance with aspect 3, the magnetic field sensor according to aspect 1 or 2 is designed to operate either in the high-resolution mode or in the low-resolution mode, wherein, in the low-resolution mode, the processing circuit is designed to generate only mean value crossing pulses in the output signal.

In accordance with aspect 4, in the magnetic field sensor according to any of aspects 1 to 3, the processing circuit is designed to generate the limit value crossing pulses with a pulse width that differs from a pulse width of the mean value crossing pulses.

In accordance with aspect 5, in the magnetic field sensor according to any of aspects 1 to 3, the processing circuit is designed, in the high-resolution mode, to generate the mean value crossing pulses and the limit value crossing pulses with the same pulse width, which differs from a pulse width of the mean value crossing pulses in the low-resolution mode.

In accordance with aspect 6, in the magnetic field sensor according to any of aspects 1 to 4, in the high-resolution mode, the processing circuit is designed to generate in each case a first limit value crossing pulse in the output signal when the oscillation signal attains a first limit value different than the mean value, and to generate a second limit value crossing pulse in the output signal when the oscillation signal attains a second limit value different than the mean value and the first limit value, wherein the first limit value crossing pulse and the second limit value crossing pulse have different pulse widths.

In accordance with aspect 7, in the magnetic field sensor according to any of aspects 1 to 6, the processing circuit is designed to generate the limit value crossing pulses with a pulse width that differs from each pulse width used in the low-resolution mode.

In accordance with aspect 8, the magnetic field sensor according to any of aspects 1 to 7 is designed to detect a movement of a magnet moving relative to the magnetic field sensor, wherein the processing circuit is designed to generate the mean value crossing pulses with a first pulse width if the movement takes place in a first direction, and to generate said mean value crossing pulses with a second pulse width different than the first pulse width if the movement takes place in a second direction opposite to the first direction.

In accordance with aspect 9, in the magnetic field sensor according to any of aspects 1 to 8, the processing circuit is designed to generate all pulses in the output signal with an identical level.

In accordance with aspect 10, in the magnetic field sensor according to any of aspects 1 to 9, a frequency of the oscillation signal is dependent on a rotational frequency of a wheel, wherein the processing circuit is designed to operate exclusively in the high-resolution mode over an entire measurement range of the rotational frequency.

In accordance with aspect 11, in a magnetic field sensor according to any of aspects 1 to 9, a frequency of the oscillation signal is dependent on a rotational frequency of a wheel, wherein the processing circuit is designed to operate in the high-resolution mode when the rotational frequency is below a limit frequency, and to operate in the low-resolution mode when the rotational frequency is above the limit frequency.

In accordance with aspect 12, a method for generating an output signal of a magnetic field sensor has the following features: generating on the basis of a varying magnetic field an oscillation signal that fluctuates around a mean value; and generating the output signal on the basis of the oscillation signal, wherein, in a high-resolution mode different than a low-resolution mode, in each case a mean value crossing pulse is generated in the output signal when the oscillation signal attains the mean value, and in each case a limit value crossing pulse is generated in the output signal when the oscillation signal attains at least one limit value different than the mean value, wherein a pulse width of at least either the mean value crossing pulse or the limit value crossing pulse is set to indicate that the method is operating in the high-resolution mode.

In accordance with aspect 13, in the method according to aspect 12, the oscillation signal represents an angle that fluctuates between 0° and 360°, wherein successive mean value crossings of the oscillation signal correspond to angles of 0° and 180°, and wherein the at least one limit value corresponds to an angle different than 0° and 180°.

In accordance with aspect 14, the method according to aspect 12 or 13 comprises switching over between the high-resolution mode and the low-resolution mode, wherein, in the low-resolution mode, only mean value crossing pulses are generated in the output signal.

In accordance with aspect 15, in the method according to any of aspects 12 to 14, the limit value crossing pulses are generated with a pulse width that differs from a pulse width of the mean value crossing pulses.

In accordance with aspect 16, in the method according to any of aspects 12 to 14, in the high-resolution mode, the mean value crossing pulses and the limit value crossing pulses are generated with the same pulse width, which differs from a pulse width of the mean value crossing pulses in the low-resolution mode.

In accordance with aspect 17, in the method according to any of aspects 12 to 16, in the high-resolution mode, in each case a first limit value crossing pulse is generated in the output signal when the oscillation signal attains a first limit value different than the mean value, and a second limit value crossing pulse is generated in the output signal when the oscillation signal attains a second limit value different than the mean value and the first limit value, wherein the first limit value crossing pulse and the second limit value crossing pulse have different pulse widths.

In accordance with aspect 18, in the method according to any of aspects 12 to 17, the limit value crossing pulses are generated with a pulse width that differs from each pulse width used in the low-resolution mode.

In accordance with aspect 19, in the method according to any of aspects 12 to 18, the oscillation signal is based on a movement of a magnet moving relative to a magnetic field sensor, wherein the mean value crossing pulses are generated with a first pulse width if the movement takes place in a first direction, and are generated with a second pulse width different than the first pulse width if the movement takes place in a second direction opposite to the first direction.

In accordance with aspect 20, in the method according to any of aspects 12 to 19, all pulses in the output signal are generated with an identical level.

In accordance with aspect 21, in the method according to any of aspects 12 to 19, a frequency of the oscillation signal is dependent on a rotational frequency of a wheel, wherein the method operates exclusively in the high-resolution mode over an entire measurement range of the rotational frequency.

In accordance with aspect 22, in the method according to any of aspects 12 to 19, a frequency of the oscillation signal is dependent on a rotational frequency of a wheel, wherein the method operates in the high-resolution mode when the rotational frequency is below a limit frequency, and operates in the low-resolution mode when the rotational frequency is above the limit frequency.

The examples described above are merely illustrative for the principles of the present disclosure. It should be understood that modifications and variations of the arrangements and of the details described are obvious to those skilled in the art. Therefore, the intention is for the disclosure to be limited only by the appended patent claims and not by the specific details set out for the purpose of the description and explanation of the examples.

LIST OF REFERENCE SIGNS

10 Sensor unit
12 Processing circuit
14 Oscillation signal
16 Output signal
20 Pole wheel
22 Shaft
24 Mean value
26 Upper limit value
28 Lower limit value
30 Limit values
32 Possible limit values
38 Switch
40 Low-resolution mode
42 High-resolution mode

The invention claimed is:

1. A magnetic field sensor, comprising:
a sensor designed to generate on the basis of a varying magnetic field an oscillation signal that fluctuates around a mean value; and
a processing circuit designed to generate an output signal on the basis of the oscillation signal, wherein, in a high-resolution mode different than a low-resolution mode, the processing circuit is designed to generate in each case a mean value crossing pulse in the output signal when the oscillation signal attains the mean value, and to generate in each case a limit value crossing pulse in the output signal when the oscillation signal attains at least one limit value different than the mean value,
wherein a pulse width of at least either the mean value crossing pulse or the limit value crossing pulse is set to indicate that the magnetic field sensor is operating in the high-resolution mode,
wherein the processing circuit is designed, in the high-resolution mode, to generate the mean value crossing pulses and the limit value crossing pulses with the same pulse width, which differs from a pulse width of the mean value crossing pulses in the low-resolution mode, and
wherein the oscillation signal represents an angle that fluctuates between 0° and 360°, successive mean value crossings of the oscillation signal correspond to angles of 0° and 180°, and the at least one limit value corresponds to an angle different than 0° and 180°.

2. The magnetic field sensor as claimed in claim 1, wherein the magnetic field sensor is designed to operate either in the high-resolution mode or in the low-resolution mode, and wherein, in the low-resolution mode, the processing circuit is designed to generate only mean value crossing pulses in the output signal.

3. The magnetic field sensor as claimed in claim 1, wherein the processing circuit is designed to generate the limit value crossing pulses with a pulse width that differs from a pulse width of the mean value crossing pulses.

4. The magnetic field sensor as claimed in claim 1, wherein, in the high-resolution mode, the processing circuit is designed to generate in each case a first limit value crossing pulse in the output signal when the oscillation signal attains a first limit value different than the mean value, and to generate a second limit value crossing pulse in the output signal when the oscillation signal attains a second limit value different than the mean value and the first limit value, wherein the first limit value crossing pulse and the second limit value crossing pulse have different pulse widths.

5. The magnetic field sensor as claimed in claim 1, wherein the magnetic field sensor is designed to detect a movement of a magnet moving relative to the magnetic field sensor, and wherein the processing circuit is designed to generate the mean value crossing pulses with a first pulse width if the movement takes place in a first direction, and to generate said mean value crossing pulses with a second pulse width different than the first pulse width if the movement takes place in a second direction opposite to the first direction.

6. The magnetic field sensor as claimed in claim 1, wherein the processing circuit is designed to generate all pulses in the output signal with an identical level.

7. The magnetic field sensor as claimed in claim 1, wherein a frequency of the oscillation signal is dependent on a rotational frequency of a wheel, and the processing circuit is designed to operate exclusively in the high-resolution mode over an entire measurement range of the rotational frequency.

8. The magnetic field sensor as claimed in claim 1, wherein a frequency of the oscillation signal is dependent on a rotational frequency of a wheel, and wherein the processing circuit is designed to operate in the high-resolution mode when the rotational frequency is below a limit frequency, and to operate in the low-resolution mode when the rotational frequency is above the limit frequency.

9. A magnetic field sensor, comprising:
a sensor designed to generate on the basis of a varying magnetic field an oscillation signal that fluctuates around a mean value; and a processing circuit designed to generate an output signal on the basis of the oscillation signal, wherein, in a high-resolution mode different than a low-resolution mode, the processing circuit is designed to generate in each case a mean value crossing pulse in the output signal when the oscillation signal attains the mean value, and to generate in each case a limit value crossing pulse in the output signal when the oscillation signal attains at least one limit value different than the mean value, wherein a pulse width of at least either the mean value crossing pulse or the limit value crossing pulse is set to indicate that the magnetic field sensor is operating in the high-resolution mode, wherein the processing circuit is designed to generate the limit value crossing pulses with a pulse width that differs from each pulse width used in the low-resolution mode, and wherein the oscillation signal represents an angle that fluctuates between 0° and 360°, successive mean value crossings of the oscillation signal correspond to angles of 0° and 180°, and the at least one limit value corresponds to an angle different than 0° and 180°.

10. A method for generating an output signal of a magnetic field sensor, comprising:

generating on the basis of a varying magnetic field an oscillation signal that fluctuates around a mean value; and generating the output signal on the basis of the oscillation signal, wherein, in a high-resolution mode different than a low-resolution mode, in each case a mean value crossing pulse is generated in the output signal when the oscillation signal attains the mean value, and in each case a limit value crossing pulse is generated in the output signal when the oscillation signal attains at least one limit value different than the mean value, wherein a pulse width of at least either the mean value crossing pulse or the limit value crossing pulse is set to indicate that the method is operating in the high-resolution mode, wherein, in the high-resolution mode, the mean value crossing pulses and the limit value crossing pulses are generated with the same pulse width, which differs from a pulse width of the mean value crossing pulses in the low-resolution mode, and wherein the oscillation signal represents an angle that fluctuates between 0° and 360°, successive mean value crossings of the oscillation signal correspond to angles of 0° and 180°, and the at least one limit value corresponds to an angle different than 0° and 180°.

11. The method as claimed in claim 10, further comprising:

switching over between the high-resolution mode and the low-resolution mode, wherein, in the low-resolution mode, only mean value crossing pulses are generated in the output signal.

12. The method as claimed in claim 10, wherein the limit value crossing pulses are generated with a pulse width that differs from a pulse width of the mean value crossing pulses.

13. The method as claimed in claim 10, wherein, in the high-resolution mode, in each case a first limit value crossing pulse is generated in the output signal when the oscillation signal attains a first limit value different than the mean value, and a second limit value crossing pulse is generated in the output signal when the oscillation signal attains a second limit value different than the mean value and the first limit value, and wherein the first limit value crossing pulse and the second limit value crossing pulse have different pulse widths.

14. The method as claimed in claim 10, wherein the oscillation signal is based on a movement of a magnet moving relative to a magnetic field sensor, and wherein the mean value crossing pulses are generated with a first pulse width if the movement takes place in a first direction, and are generated with a second pulse width different than the first pulse width if the movement takes place in a second direction opposite to the first direction.

15. The method as claimed in claim 10, wherein all pulses in the output signal are generated with an identical level.

16. The method as claimed in claim 10, wherein a frequency of the oscillation signal is dependent on a rotational frequency of a wheel, and wherein the method operates exclusively in the high-resolution mode over an entire measurement range of the rotational frequency.

17. A method for generating an output signal of a magnetic field sensor, comprising:

generating on the basis of a varying magnetic field an oscillation signal that fluctuates around a mean value; and generating the output signal on the basis of the oscillation signal, wherein, in a high-resolution mode different than a low-resolution mode, in each case a mean value crossing pulse is generated in the output signal when the oscillation signal attains the mean value, and in each case a limit value crossing pulse is generated in the output signal when the oscillation signal attains at least one limit value different than the mean value, wherein a pulse width of at least either the mean value crossing pulse or the limit value crossing pulse is set to indicate that the method is operating in the high-resolution mode, wherein the limit value crossing pulses are generated with a pulse width that differs from each pulse width used in the low-resolution mode, and wherein the oscillation signal represents an angle that fluctuates between 0° and 360°, successive mean value crossings of the oscillation signal correspond to angles of 0° and 180°, and the at least one limit value corresponds to an angle different than 0° and 180°.

18. The method as claimed in claim 10, wherein a frequency of the oscillation signal is dependent on a rotational frequency of a wheel, and wherein the method operates in the high-resolution mode when the rotational frequency is below a limit frequency, and operates in the low-resolution mode when the rotational frequency is above the limit frequency.

* * * * *